(12) United States Patent
Joutsenoja et al.

(10) Patent No.: US 8,106,663 B2
(45) Date of Patent: *Jan. 31, 2012

(54) SENSOR PRODUCT FOR ELECTRIC FIELD SENSING

(75) Inventors: Timo Joutsenoja, Tampere (FI); Kari Kyyny, Tampere (FI)

(73) Assignee: Marimils Oy, Vantaa (FI)

( * ) Notice: Subject to any disclaimer, the term of this patent is extended or adjusted under 35 U.S.C. 154(b) by 0 days.

This patent is subject to a terminal disclaimer.

(21) Appl. No.: 12/796,227

(22) Filed: Jun. 8, 2010

(65) Prior Publication Data
US 2010/0244810 A1    Sep. 30, 2010

Related U.S. Application Data

(62) Division of application No. 12/796,227, filed as application No. PCT/FI2005/000312 on Nov. 19, 2007, now Pat. No. 8,044,665.

(60) Provisional application No. 11/631,893, filed on Jul. 5, 2005.

(51) Int. Cl.
*G01R 29/12* (2006.01)
*H03M 11/00* (2006.01)
*G06F 3/041* (2006.01)

(52) U.S. Cl. ............... 324/457; 341/33; 345/173
(58) Field of Classification Search .......... 324/457; 341/33
See application file for complete search history.

(56) References Cited

U.S. PATENT DOCUMENTS

| | | | |
|---|---|---|---|
| 4,106,107 A | 8/1978 | Goodman | |
| 4,380,040 A | 4/1983 | Posset | |
| 4,495,485 A | 1/1985 | Smith | |
| 4,766,368 A | 8/1988 | Cox | |
| 4,806,709 A | 2/1989 | Evans | |
| 4,954,814 A * | 9/1990 | Benge | ........................ 340/572.3 |
| 5,430,613 A * | 7/1995 | Hastings et al. | .............. 361/760 |
| 5,512,836 A | 4/1996 | Chen et al. | |
| 5,572,205 A | 11/1996 | Caldwell et al. | |
| 5,594,222 A | 1/1997 | Caldwell | |
| 5,933,102 A | 8/1999 | Miller et al. | |
| 5,964,478 A | 10/1999 | Stanley et al. | |
| 6,246,224 B1 | 6/2001 | Brown | |
| 6,310,611 B1 | 10/2001 | Caldwell | |
| 6,980,017 B1 | 12/2005 | Farnworth et al. | |
| 7,145,552 B2 | 12/2006 | Hollingsworth | |
| 7,487,064 B2 * | 2/2009 | Lim | .............................. 702/179 |
| 2003/0103043 A1 | 6/2003 | Mulligan et al. | |

FOREIGN PATENT DOCUMENTS

WO    WO-01/11776 A1    2/2001

OTHER PUBLICATIONS

PCT/ISA/210—International Search Report—Nov. 4, 2005.
PCT/ISA/237—Written Opinion of the International Searching Authority—Nov. 4, 2005.

* cited by examiner

*Primary Examiner* — Jeff Natalini
(74) *Attorney, Agent, or Firm* — Venable LLP; Eric J. Franklin

(57) ABSTRACT

A sensor product web for electric field sensing. The sensor includes a substrate, sequential electrically conductive areas on a surface of the substrate, conductors, an output connected to one of the electrically conductive areas by one of the conductors, a dielectric layer arranged on top of the conductors, and an electrically conductive layer arranged on top of the dielectric layer on a same surface of the substrate as the electrically conductive areas, the dielectric layer being discontinuous at the conductor which is in contact with the electrically conductive area.

5 Claims, 5 Drawing Sheets

SENSOR PRODUCT FOR ELECTRIC FIELD SENSING

CROSS-REFERENCE TO RELATED APPLICATIONS

This application is a divisional application of U.S. patent application Ser. No. 11/631,893 filed Nov. 19, 2007, which is the national phase under 35 U.S.C. §371 of PCT/FI2005/000312 filed 5 Jul. 2005 and claims priority to U.S. provisional patent application No. 60/585,711 filed 6 Jul. 2004.

FIELD OF INVENTION

The present invention relates to a sensor product. The sensor product can be used in computer user interfaces, occupant or passenger monitoring systems, e.g. in keyboards, smart air bag systems, and floor constructions.

BACKGROUND

Electric field sensing refers to a method for determining positions, movements and geometries of objects on the basis of disturbances which they cause to a surrounding electric field.

Most of the pioneering work in electric field sensing can be attributed to nature. Electric fields are, used by various aquatic animals for sensing their environment, especially in the dark, muddy waters where light is scarce (Bastian J., Electrosensory Organism, Physics Today, pages 30-37, February 1994).

Professor Neil Gershenfeld's group at the MIT Media Laboratory has applied electric field sensing for measurements of position, shape and size since the early 1990's. Prof. Gershenfeld's group has, for example, developed an interface for human-computer interaction based on electric field sensing and charge source tomography.

In the University of Queensland there has also been studied electric field sensing. A low frequency electric field is generated in order to induce a current and the induced current is measured at receiving nodes. When an object interferes with the electric field, the capacitance of the environment is altered and the received current values are changed. By modeling the effect of a foreign body in the field, the characteristics of this body can be derived by the current values obtained (O'Brien Christopher John, Electric Field Sensors for Non Contact Graphical Interfaces, Thesis, School of information technology and Electrical Engineering, University of Queensland, 2001).

A critical component of any intelligent environment is a user interface. All user interfaces, such as keyboard, mouse, touchpad and touch screen, have their pros and cons. Most of the user interface devices are typically relatively fragile and expensive, have limited scalability for large areas, and are poorly applicable for use outdoors or in harsh environments. Charge source tomography (CST) is a method for sensing an interaction between a user and flat or curved surfaces which are made sensitive by an addition of a conformable resistive sheet that is able to create electric fields. The CST-based user interface device comprises a resistive sheet, peripheral electrodes, and a current/voltage controller. During operation, a controller applies voltage patterns to points on the perimeter of the resistive sheet and measures the currents that arise as a consequence. The user appears in this system as a capacitive load localized to some region of the resistive sheet. (Post E Rehmi, Agarwal Ankur, Pawar Udai, and Gershenfeld Neil, Scalable Interactive Surfaces via Charge Source Tomography, 2nd International Conference on Open Collaborative Design of Sustainable Innovation. Dec. 1-2, 2002, Bangalore, India; Strachan John Paul, Instrumentation and Algorithms for Electrostatic Inverse Problems, Masters Thesis, Massachusetts Institute of Technology, Cambridge, Mass., 2001.)

The CST enables an interactive surface to be used with bare hands without touching. Furthermore, the CST makes it possible to manufacture low-cost and mechanically robust user interface devices that are scalable and easy to embed into a variety of surface materials and shapes.

SUMMARY OF THE INVENTION

A general object of the invention is to provide a cost-effective sensor product for touch-free interfaces. The sensor product may comprise several layers attached to each other.

A specific object is to provide a sensor product that comprises an array or matrix of electrically conductive areas and conductors on a flexible substrate, and a method for manufacturing it. The electrically conductive areas form sensor elements. In this arrangement the sensed area is scalable by increasing the number of the electrically conductive areas. It is also possible to increase the area of the electrically conductive areas and the distances between them at the expense of resolution.

Another specific object is to provide a sensor product, also known as a resistive sheet laminate, comprising an electrically conductive area, which includes a resistive sheet and peripheral electrodes on a flexible substrate, and a method for manufacturing it. In this arrangement the area of the resistive sheet is scalable without changing the number of electrodes. A further specific object is to provide ways of adjusting the conductivity of the resistive sheet.

The present invention also provides conductors between the electrically conductive areas and the output and protective layers if desired. The conductors may be made using the same material and manufacturing process as the electrodes. However, in order to maximize the cost efficiency in some cases it might be advantageous to use a different material and process for electrodes and conductors. The manufacturing process steps of the present invention also enable utilization of a continuous roll-to-roll process.

This invention is not limited to the CST-based user interfaces, but may also be applied to similar sensor technologies, such as capacitive sensors and electrical impedance tomography.

A characteristic feature of the products in accordance with the present invention is a layered structure that comprises conducting sensor elements, or a resistive sheet and peripheral electrodes as an alternative structure. Optional features are that said layered structure also comprises conductors between the electrically conductive areas and the output and protective layers.

The sensor product of the invention can be used, for example, for user-computer interfaces and for sensing bodies. The touch-free operation, scalability, flexibility, robustness, and low-cost manufacturing enable a large variety of applications. In connection with the user-computer interfaces, the sensor product can be a substitute for a keyboard, a mouse, a touch pad, or a touch screen, or the sensor product can be used in parallel with them. The sensor product can be used as smart blackboards, whiteboards, or flipcharts. Further, the sensor product can be used at info kiosks, cash machines, and in industrial control panels. The sensor product can be hidden in/on/behind/under construction elements, for example walls, panels, boards, tables, displays, windows, or posters.

In the body sensing the sensor product can be used for identifying the presence, orientation, location, or movement of a body. The sensor product can be hidden as a sensor mat into/onto/under/behind floors, walls, roofs, or seats. The sensor product can be used for car passenger sensing for example for air bag control, or air condition control. Other uses of the sensor product include safety and security applications, access control systems, burglar alarm systems, safety and monitoring systems for aged and disabled people, building automation, lighting control, or air conditioning.

The sensor product of the invention comprises a substrate, an output, at least one electrically conductive area on the surface of the substrate and at least one conductor between the at least one electrically conductive area and the output. The electrically conductive area may comprise sub-areas, whose electrical conductivity differs from each other, or the electrically conductive area may have substantially the same conductivity throughout the whole area.

The substrate is a sheet-like material, or a film. The substrate comprises plastic material, or fibrous material in a form of a nonwoven fabric, fabric, paper, or board. Suitable plastics are, for example, plastics comprising polyethyleneterephtalate (PET), polypropylene (PP), or polyethylene (PE). The substrate is preferably substantially flexible in order to conform with other surfaces on which it is placed. Besides one layer structure, the substrate can comprise more layers attached to each other. The substrate may comprise layers that are laminated to each other, extruded layers, coated or printed layers, or mixtures of those.

The sensor product is provided with an output in order to make it possible to connect the output to control electronics. Measurement voltages and control output currents can be fed through the output. In practice the output can comprise conductors next to each other. A standard connector used in common electronic applications (e.g. Crimpflex®, Nicomatic SA, France) can be added to the output.

At least one electrically conductive area and at least one conductor between the electrically conductive area and the output is formed on the surface of the substrate. According to one embodiment of the invention, the sensor product comprises an electrically conductive area which includes a resistive sheet and at least one peripheral electrode on a flexible substrate. Usually there are more than one electrodes and conductors because accurate sensing requires several electrodes. The number of electrodes also depends on number of variables to be solved. The electrodes and the conductors comprise metal, electrically conductive carbon, or electrically conductive polymers. Common metals in that use are aluminium, copper and silver. Electrically conductive carbon may be mixed in a medium in order to manufacture an ink or a coating. Examples of electrically conductive polymers are polyacetylene, polyaniline and polypyrrole. The electrodes and the connectors can be made, for example, by etching or printing.

The resistive sheet is preferably a rectangular area formed on the surface of the substrate. The term "resistive" refers to the fact that the resistive sheet typically possesses a lower electrical conductivity than the electrodes and the conductors. The resistive sheet has an electrical resistance in a range between 100 k$\Omega$ and 10 M$\Omega$, preferably in a range between 0.9 M$\Omega$ and 1.1 M$\Omega$. The resistance value is measured between electrodes which are placed on the opposite sides of the rectangle which forms the resistive sheet (HP 34401 A multimeter, T=23° C., RH=50%, U=1.8V). In other words, the resistance value must be in the predetermined range independent from the size of the resistive sheet, and by adjusting the raw materials of the resistive sheet the resistance value can be adjusted to a desired level.

The resistive sheet comprise electrically conductive material, and it can be a printed layer, a coated layer, a plastic layer, or a fibrous layer. As an electrically conductive element the resistive sheet may comprise conductive carbon, metallic layers, particles, or fibers, or electrically conductive polymers, such as polyacetylene, polyaniline, or polypyrrole. When a transparent sensor product is desired, electrically conductive materials like ITO (indium tin oxide), PEDOT (poly-3,4-ethylenedioxythiophene), or carbon nanotubes can be used. For example, the carbon nanotubes can be used in coatings which comprise the nanotubes and polymers. The same electrically conductive materials also apply to the electrodes and the conductors.

According to another embodiment of the invention, the sensor product comprises an array or matrix of electrically conductive areas on a flexible substrate. The electrically conductive areas do not necessarily comprise separate electrodes but the electrically conductive area may comprise the same material throughout the electrically conductive area. In that embodiment it is advantageous that the electrically conductive areas have a high electrical conductivity.

The electrically conductive area can be of metal, electrically conductive carbon, or electrically conductive polymer. Common metals for that use are aluminium, copper and silver. Electrically conductive carbon may be mixed in a medium in order to manufacture an ink or a coating. Examples of the electrically conductive polymers are polyacetylene, polyaniline and polypyrrole. Although there may be difference in the electrical conductance, the same electrically conductive materials, which are mentioned in connection with the resistive sheet, also apply to the electrically conductive areas and conductors of the product according to the second embodiment. The electrically conductive area can be made, for example, by etching or printing.

There are various techniques available for forming the electrically conductive areas and the conductors, for example etching, screen printing (flat bed or rotation), gravure, offset, flexography, inkjet printing, electrostatography, electroplating and chemical plating.

On the surface of the substrate there may be a protecting layer which can be any flexible material, for example paper, board, or plastic, such as PET, PP, or PE. The protecting layer may be in the form of a nonwoven, fabric, or a foil. A protective dielectric coating, for example an acrylic based coating, is possible.

BRIEF DESCRIPTION OF THE FIGURES

In figures.

DETAILED DESCRIPTION

Figure 1A:
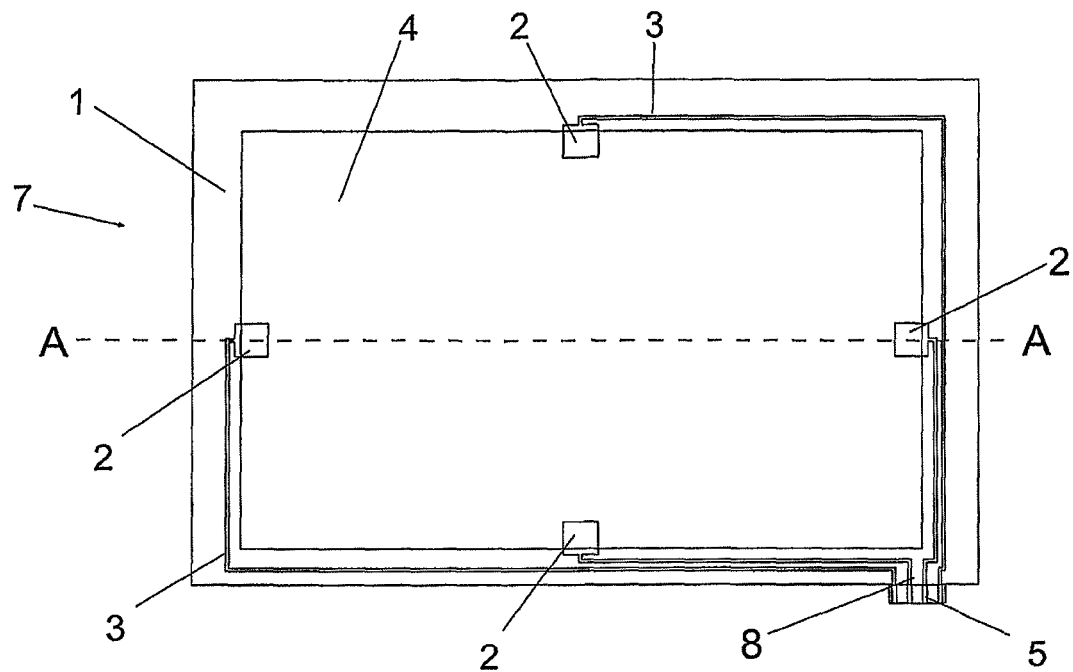
FIG. 1a shows a top view of a sensor product.
Figure 1B:
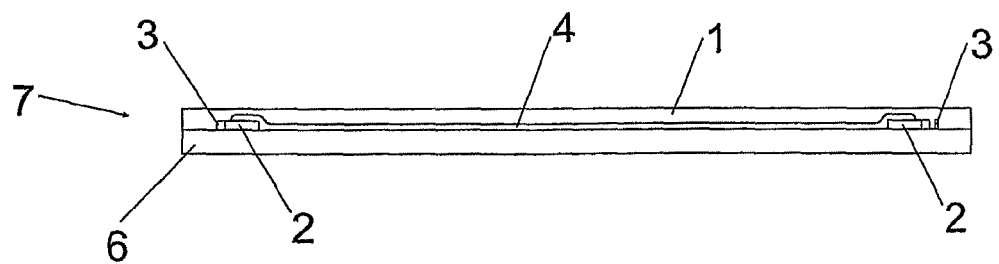
FIG. 1b shows a cross section of the sensor product of FIG. 1.

FIG. 1a shows a top view and FIG. 1b shows a cross section of a sensor product 7 (section A-A). Electrodes 2 and conductors 3 are formed on a surface of a substrate 6. The conductors 3 connect the electrodes 2 via an output 8 to a connector 5. A resistive sheet 4 overlaps the electrodes 2. A protecting layer 1 is formed on top of the substrate in such a manner that the electrodes 2, conductors 3 and the resistive sheet remain between the substrate 6 and the protecting layer 1.

Figure 2A:
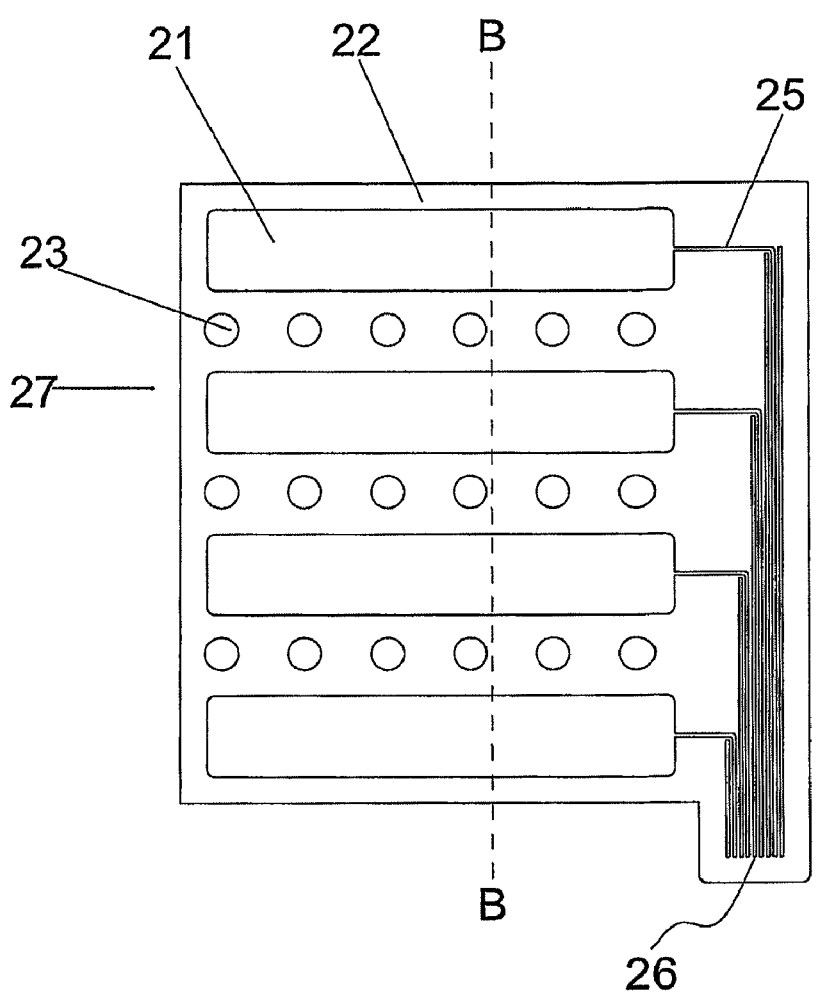
FIG. 2a shows a top view of a potential sensor product structure for passenger sensing applications used in smart air bag systems.
Figure 2B:
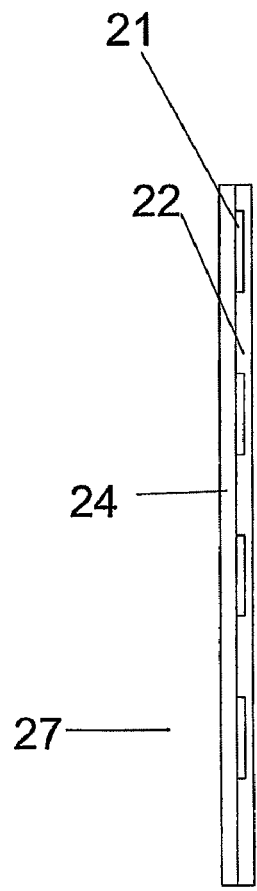
FIG. 2b shows a cross-sectional view of the sensor product structure of FIG. 2a, FIG. 3a shows a top view of a sensor product for monitoring conductive objects.

FIG. 2 illustrates a potential sensor product structure for passenger sensing applications used in smart air bag systems. FIG. 2a shows a top view and FIG. 2b shows a cross-sectional view (section B-B). The sensor product comprises a substrate 24 on the surface of which are formed electrically conductive areas which form sensor elements 21. The sensor elements 21 are connected to an output 26 via conductors 25. The output 26 connects the sensor product 27 to the electronics. Number 23 denotes ventilation holes. On top of the substrate there is a protecting layer 22.

Figure 3A:
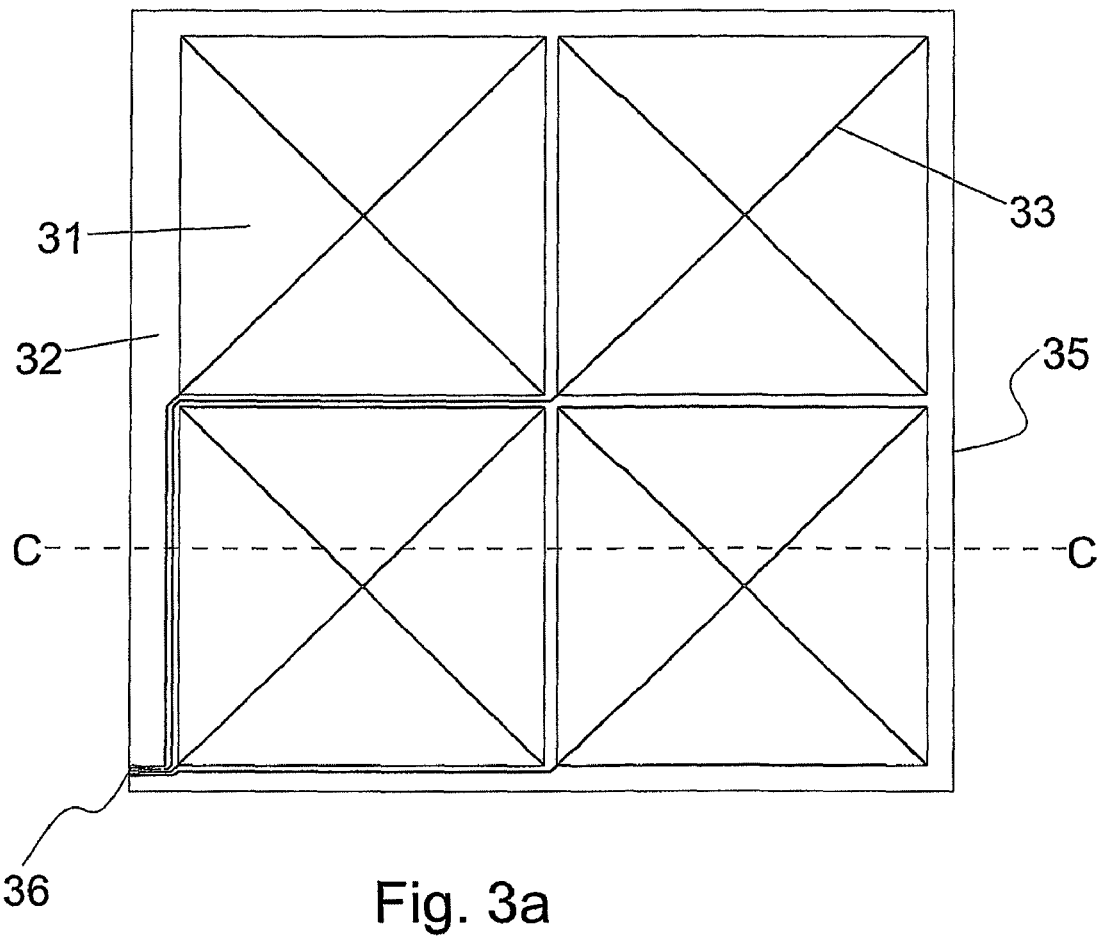
FIG. 3b shows a cross-sectional view of the sensor product of FIG. 3a, FIG. 4a shows a top view of a sensor product for monitoring conductive objects.
Figure 3B:
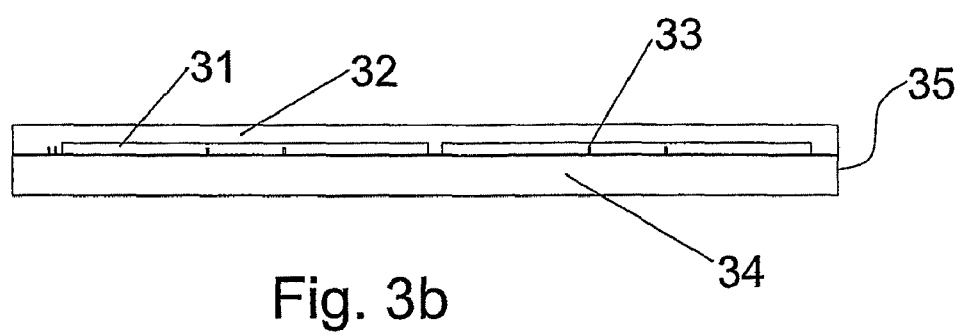

FIG. 3 illustrates a sensor product for monitoring electrically conductive objects, for example movement and location of a human body. This application is mainly used for monitoring aged and disabled people. FIG. 3a shows a top view and FIG. 3b shows a cross-sectional view (section C-C). The sensor product 35 comprises a substrate 34, electrically conductive areas which form sensor elements 31 formed on the surface of the substrate 34 and conductors 33 connecting the sensor elements 31 to an output. On top of the substrate 34 there is a protecting layer 32.

Figure 4A:
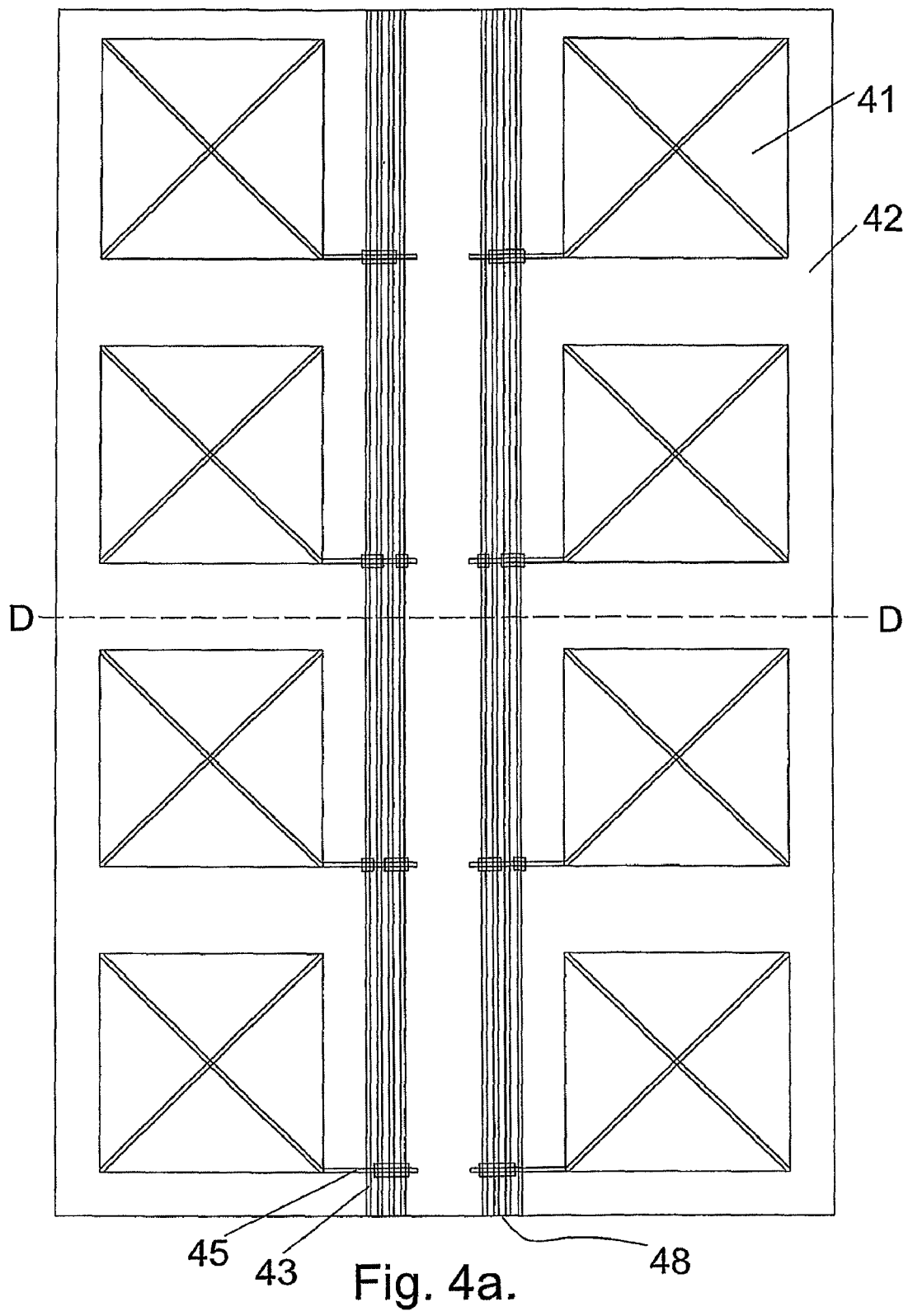
FIG. 4b shows a cross-sectional view of the sensor product of FIG. 4a, FIG. 4c shows a top view from a junction of conductors and a dielectric/conductive bridge.
FIG. 4d shows a cross-sectional view from a junction of conductors and a dielectric/conductive bridge.
Figure 4B:
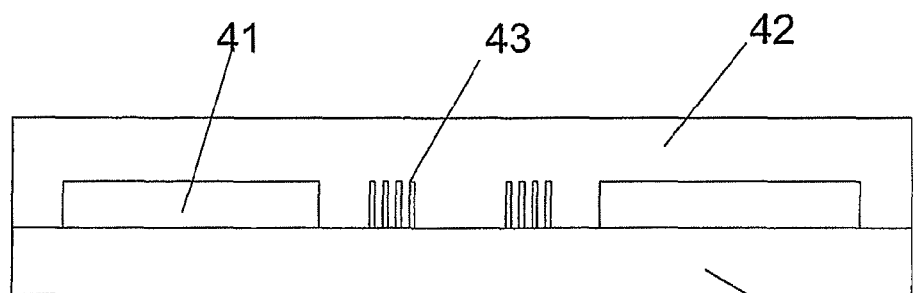

FIG. 4a shows a top view of a sensor product for monitoring electrically conductive objects, for example movement and location of a human body and FIG. 4b shows a cross-sectional view of the sensor product of FIG. 4a (section D-D). This application is mainly used for monitoring aged and disabled people. The sensor product can be manufactured as a continuous web in a roll-to-roll process. The sensor product comprises a substrate 44, an electrically conductive area 41 and conductors 43 on the surface of the substrate 44. On the surface of the substrate 44 there is a protecting layer 42. The electrically conductive area 41 and the conductors 43 remain between the substrate 44 and the protecting layer 42. Number 45 denotes a dielectric bridge onto which surface an electrically conductive bridge is printed. In this manner the sensor product can be manufactured as a continuous roll, and the continuous roll can be cut at a desired point. Number 48 denotes an output but the output can be formed at any cutting point, for example at section D-D shown in FIG. 4a.

Figure 4C:
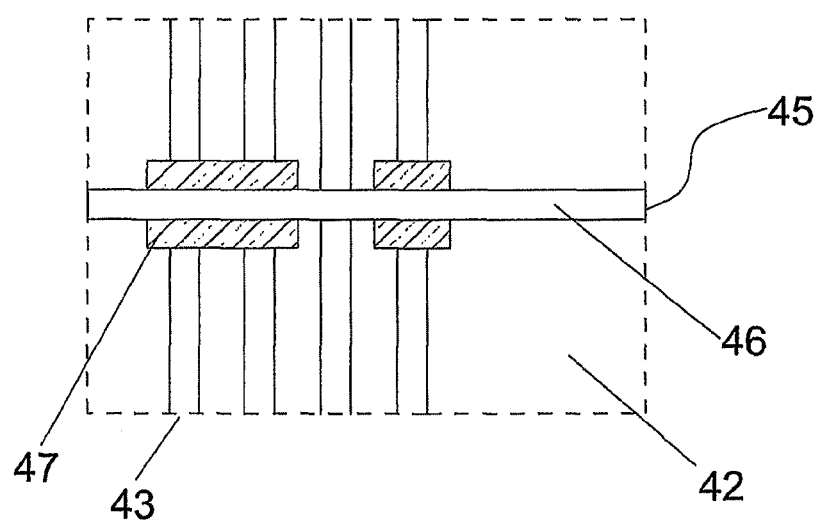
Figure 4D:
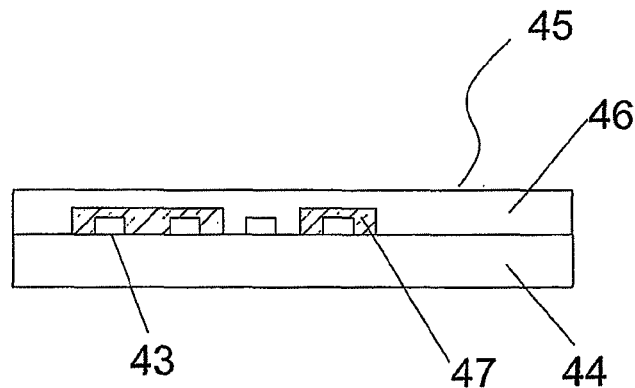

FIGS. 4c and 4d shows views from the junction of the conductors 43 and the dielectric/conductive bridge 45 (which is also shown in FIG. 4a). The dielectric/conductive bridge 45 comprises two layers, a conductive layer 46 and a dielectric layer 47. When the conductor 43 is not intended to contact the conductive layer 46 of the bridge 45, the dielectric layer 47 is formed on the surface of the conductor 43 and the conductive layer 46 is formed on the surface of the dielectric layer 47. When the conductor 43 should make a contact with the conductive layer 46 of the bridge 45 the dielectric layer is omitted from that point.

The technique by which the bridge arrangement is formed may be a flexible printing technique, for instance ink-jet printing. By the printing technique it is possible to print diverse patterns according to the need.

In the following, the invention is described by examples:

EXAMPLE 1

A sensor product according to FIG. 1 was manufactured. The electrodes and conductors of the sensor product are of aluminium, and the resistive sheet is a printed area. The electrically conductive element of the printing ink is carbon.

The manufacturing process of the sensor product comprises:
1. The conductors and electrodes can be made by any known aluminum etching technique by using the following process:
    a. Resist printing i.e. printing a conductor/s and an electrode pattern/s to a Al/PET laminate (e.g. PET/adhesive/aluminium) with a resist ink (e.g. Coates XV1000-2).
    b. Etching of the Al/PET laminate
2. A resistive sheet is printed by using conducting carbon ink (e.g. Dupont 7102) on top of the etched PET-film. The conductivity of the carbon ink can be adjusted to the desired level by using dielectric paste (e.g. Dupont 3571). According to the research results, optimal resistance with a 141×225 mm size sheet is 0.9-1.1 MΩ, measured between two electrodes which are placed at opposite sides of the rectangle forming the resistive sheet (the measurement is made in the length direction of the rectangle, i.e. in the direction where the longest distance between the electrodes is possible). The resistance may vary from 10 kΩ to 100 MΩ depending on the size of the sheet and the application. The carbon printed area overlaps the aluminum electrodes.
3. Lamination of a protective layer (e.g. self adhesive PP- or PE-film).
4. Die-cutting of the sensor product to a desired format.
5. Fastening of a connector (e.g. standard Crimpflex connector) by any standard crimping machine or method.

The resist printing can be made by any common printing techniques, for example by screen printing (flat bed or rotation), gravure, offset, or flexography.

The etching can be made by any common etching process, for example a process based on ferric chloride, sodium hydroxide, or hydrogen chloride.

Any other conducting inks can also be used to form the resistive sheet area, the conductors and the electrodes. The resistive sheet area can be printed by any common printing techniques, for example by screen printing (flat bed or rotation), gravure, offset or flexography.

It is also possible to make the resistive sheet area by using any conventional coating technology and print or tape, or by other means fabricate electrodes on top of the coated resistive area.

EXAMPLE 2

A sensor product according to FIG. 1 was manufactured. Electrodes and conductors of the sensor product are of copper, and the resistive sheet is a printed area. The electrically conductive element of the printing ink is carbon.
Manufacturing Steps:
1. Conductors and electrodes can be made by any known copper etching technique by using the following process steps:

a. Resist printing i.e. printing conductor and electrode pattern on the copper PET laminate with resist ink (e.g. Coates XV1000-2).
b. Etching of copper laminate (e.g. PET-adhesive-copper).
2. Resistive area (the resistive sheet) is printed by using electrically conductive carbon ink (e.g. Dupont 7102) on top of the etched PET-film. The conductivity of the carbon ink can be adjusted to the desired level by using a dielectric paste (e.g. Dupont 3571). According to the research results, optimal resistance with a 141×225 mm size sheet is 0.9-1.1 MΩ, measured between two electrodes at opposite sides of the sheet in the length direction. The resistance may vary from 10 kΩ to 100 MΩ depending on the size of the sheet and the application). The carbon printed area overlaps with the copper electrodes.
3. Lamination of protective layer (e.g. PP- or PE-film).
4. Die-cutting of the resistive sheet laminate to the desired format.
5. Connector fastening (e.g. standard Crimpflex connector) by any standard crimping machine or method.

Resist printing can be made by any common printing technique, such as, for example, screen printing (flat bed or rotation), gravure, offset or flexography.

Etching can be any common etching process; for example a process based on ferric chloride, copper chloride.

The resistive area can be printed by any common printing technique, for example, screen printing (flat bed or rotation), gravure, offset or flexography.

Any other conducting inks can also be used to form the resistive area, conductors and electrodes.

It is also possible to make the resistive area by using any conventional coating technology and print or tape, or by other means fabricate electrodes on top of the coated resistive area.

EXAMPLE 3

A sensor product according to FIG. 1 was manufactured. Electrodes and conductors of the sensor product are printed with a silver ink, and the resistive sheet is a printed area. The electrically conductive element of the printing ink is carbon.
Manufacturing Steps:
1. Conductors and electrodes are printed with conducting silver ink on the substrate (e.g. PET film)
2. A resistive sheet area is printed by using conducting carbon ink (e.g. Dupont 7102) on top of the etched PET-film. Conductivity of the carbon ink can be adjusted to the desired level by using dielectric paste (e.g. Dupont 3571). According to the research results, optimal resistance with a 141×225 mm size sheet is 0.9-1.1 MΩ, measured between two electrodes at opposite sides of the sheet in the length direction. The resistance may vary from 10 kΩ to 100 MΩ depending on the size of the sheet and the application). The carbon printed area overlaps with the silver electrodes.
3. Lamination of a protective layer (e.g. PP- or PE-film).
4. Connector fastening (e.g. standard Crimpflex connector) by any standard crimping machine or method.

Conductors and electrodes can be printed by any common printing technique, such as, for example screen printing (flat bed or rotation), gravure, offset or flexography.

The resistive area can be printed by any common printing technique; for example, screen printing (flat bed or rotation), gravure, offset or flexography.

Any other conducting inks can also be used to form the resistive area, conductors and electrodes.

It is also possible to make the resistive area by using any conventional coating technology and print or tape, or by other means fabricate electrodes on top of the coated resistive area.

EXAMPLE 4

A sensor product according to FIG. 1 was manufactured. Electrodes and conductors of the sensor product were printed with a silver ink, and the resistive sheet was made of electrically conductive carbon paper.
Manufacturing Steps:
1. Manufacturing of conducting carbon paper by mixing the conductive carbon to the suspension or by coating the paper with conductive carbon.
2. Forming rectangle resistive sheet "window" by printing dielectric (e.g. acrylic based topcoat) to the edges.
3. Conductors and electrodes are printed with conducting silver ink onto the dielectric area. Electrodes are overlapping with the rectangle resistive sheet.
4. Lamination of a protective layer (e.g. PP- or PE-film).
5. Die-cutting the resistive sheet laminate to the desired format.
6. Connector fastening (e.g. standard Crimpflex connector) by any standard crimping machine or method.

Dielectric, conductors and electrodes can be printed by any common printing techniques, such as, for example, screen printing (flat bed or rotation), gravure, offset or flexography. Any other conducting inks can also be used to form resistive area, conductors and electrodes.

EXAMPLE 5

A sensor product according to FIG. 2 was manufactured (FIG. 2 illustrates a potential sensor product structure for passenger sensing applications used in smart air bag systems).
Manufacturing Steps:
1. Conductors are printed with conducting silver ink on the substrate (e.g. PET film)
2. Sensor elements area printed by using conducting carbon ink (e.g. Dupont 7102) on top of the conductors.
3. Lamination of a protective layer (e.g. PP- or PE-film).
4. Punching of ventilation holes
5. Connector fastening (e.g. standard Crimpflex connector) by any standard crimping machine or method.

Conductors and electrodes can be printed by any common printing technique, such as, for example, screen printing (flat bed or rotation), gravure, offset or flexography. Any conducting inks can be used to form conductors and electrodes.

The sensor element area can be printed by any common printing techniques for example screen printing (flat bed or rotation), gravure, offset or flexography. Any conducting inks can be used to form sensor elements.

It is also possible to etch sensor elements, conductors and electrodes from aluminum, or copper.

EXAMPLE 6

A sensor product according to FIG. 3 was manufactured (FIG. 3 illustrates a sensor laminate structure for monitoring electrically conductive objects, for example movement and location of a human body).
Manufacturing Steps:
1. Conductors are printed with conducting silver ink on the substrate (e.g. PET film)
2. The sensor elements area (the electrically conductive areas) is printed by using conductive carbon ink (e.g. Dupont 7102) on the top of the conductors.
3. Lamination of a protective layer (e.g. PP- or PE-film).
4. Punching of ventilation holes (optional)
5. Connector fastening (e.g. standard Crimpflex connector) by any standard crimping machine or method.

Conductors and electrodes can be printed by any common printing technique, such as, for example, screen printing (flat bed or rotation), gravure, offset or flexography. Any conducting ink can be used to form conductors and electrodes.

The sensor element area can be printed by any common printing technique, for example, screen printing (flat bed or rotation), gravure, inkjet, offset or flexography. Electrostatography is also a usable method. Any conducting ink can be used to form sensor elements.

EXAMPLE 7

A sensor product according to FIG. 3 was manufactured.
Manufacturing Steps:
1. Conductors and sensor elements are etched from aluminum-PET laminate by using any known aluminum etching technique and the following process steps:
    a. Resist printing i.e. printing conductor and sensor element pattern to the aluminum PET laminate with resist ink (e.g. Coates XV1000-2).
    b. Etching of aluminum laminate (e.g. PET-adhesive-aluminum).
Besides etching, electroplating and chemical plating are as well practicable.
2. Lamination of a protective layer (e.g. PP- or PE-film).
3. Punching of ventilation holes (optional)
4. Connector fastening (e.g. standard Crimpflex connector) by any standard crimping machine or method.

Conductors and sensor elements can also be etched from copper by using any known etching process, such as, for example, ferric chloride or copper chloride based process.

EXAMPLE 8

A sensor product according to FIG. 4 was manufactured.
FIG. 4 illustrates a sensor laminate structure for monitoring aged and disabled people. This web structure enables cutting of the web at any point between the individual sensor elements because an output forms at the cutting point. The maximum number of the sensor elements in a sheet is the number of the output lines.
Manufacturing Steps:
1. Continuous conductor lines are printed on the surface of the web with conducting silver ink in the first printing station. The amount of the conductor lines defines the maximum amount of the sensor elements in a single row and the shared connection to the electronics.
2. Sensor elements area printed by using conducting carbon ink (e.g. Dupont 7102).
3. A dielectric bridge is printed in the next process step to electrically isolate the connection between the conductor lines and a conductive bridge that will be printed in the next step. A suitable printing technique for printing the dielectric bridge is, for example, ink-jet.
4. The conductive bridge that connects the sensor element to an individual conducting line can be printed after that by using conducting silver ink.
5. Lamination of a protective layer (e.g. PP- or PE film).
6. Punching of ventilation holes (optional)
7. Connector fastening (e.g. standard Crimpflex connector) by any standard crimping machine or method.

EXAMPLE 9

In accordance with example 8, but it is also possible to create a connection between the sensor element and individual conductor by using printed sensor elements or etched aluminum- or copper laminate as a sensor element and drill vias trough the substrate material to sensor element e.g. by using UV-laser. After making vias, conducting lines are printed with conducting ink to the reverse side of the laminate. Conducting ink fills the vias and creates contact between the conductor and sensor element.

EXAMPLE 10

In accordance with example 8, but it is also possible to create a connection between the sensor element and output by using group of linear continuous lines parallel to the web on the backside of the substrate while the electrically conductive sensor elements are formed on the front side. The parallel conductors on the backside can be formed by etching or printing or by laminating of a flat cable on the backside of substrate. The contact between single conductor line on backside and sensor element on the front side is formed in two steps:
1. vias are drilled (e.g. by using UV-laser) through the substrate to a single continuous conductors on the back side at the perpendicular location of sensor elements, and
2. conductors printed with conductive ink on the front side of substrate perpendicular to the web across the via and the sensor elements, and the ink fills the vias and creates contact between the single backside conductor and the front side sensor element.

The invention claimed is:

1. A sensor product web for electric field sensing, the sensor comprising:
    a substrate comprising a continuous roll of material;
    a plurality of sequential electrically conductive areas on a surface of the substrate;
    a plurality of conductors arranged on the surface of the substrate;
    an output connected to one of the electrically conductive areas by one of the conductors;
    a plurality of dielectric layers arranged on top of the conductors, wherein one of the dielectric layers is arranged in the vicinity of each electrically conductive area; and
    a plurality of an electrically conductive layers arranged on top of the dielectric layers on a same surface of the substrate as the electrically conductive areas, each of the electrically conductive layers extends between the one of the electrically conductive areas and the conductors, and the dielectric layer being discontinuous at one of the conductors, thereby resulting in an electrically conductive path between one of the electrically conductive areas and one of the conductors, thereby permitting the cutting of the substrate at a plurality of points to form output including at least one electrically conductive area and at least one associated conductor.

2. The sensor product web according to claim 1, wherein the electrically conductive area comprises a printed or coated layer.

3. The sensor product web according to claim 1, wherein the electrically conductive area comprises a plastic layer, or a fibrous layer.

4. The sensor product web according to claim 1, wherein the electrically conductive area and the conductor comprise metal, conductive carbon, or electrically conductive polymers.

5. The sensor product web according to claim 1, wherein the sensor product comprises a top layer comprising a film of plastic material, paper, or board, or a dielectric coating.

* * * * *

UNITED STATES PATENT AND TRADEMARK OFFICE
CERTIFICATE OF CORRECTION

PATENT NO. : 8,106,663 B2  
APPLICATION NO. : 12/796227  
DATED : January 31, 2012  
INVENTOR(S) : Timo Joutsenoja et al.

Page 1 of 1

It is certified that error appears in the above-identified patent and that said Letters Patent is hereby corrected as shown below:

Correct the priority information on the Title page, item

"(62)   Division of application No. 12/796,227, filed as application No. PCT/FI2005/000312 on November 19, 2007, now Pat. No. 8,044,665.

(60)   Provisional application No. 11/631,893, filed on Jul. 5, 2005."

to

--(62)   Division of application No. 11/631,893, filed on November 19, 2007, as the national phase of application No. PCT/FI2005/000312, filed on July 5, 2005, now Pat. No. 8,044,665.

(60)   Provisional application No. 60/585,711, filed on Jul. 6, 2004.--

Signed and Sealed this  
Twelfth Day of February, 2013

Teresa Stanek Rea  
*Acting Director of the United States Patent and Trademark Office*